United States Patent
Pignatelli et al.

(10) Patent No.: US 9,953,722 B2
(45) Date of Patent: Apr. 24, 2018

(54) METHODS OF SYSTEM OPTIMIZATION BY OVER-SAMPLING READ

(71) Applicant: SK hynix Inc., Gyeonggi-do OT (KR)

(72) Inventors: David J. Pignatelli, Saratoga, CA (US); June Lee, Sunnyvale, CA (US); Fan Zhang, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 12 days.

(21) Appl. No.: 14/991,681

(22) Filed: Jan. 8, 2016

(65) Prior Publication Data

US 2016/0202934 A1 Jul. 14, 2016

Related U.S. Application Data

(60) Provisional application No. 62/101,308, filed on Jan. 8, 2015.

(51) Int. Cl.
| | |
|---|---|
| *G11C 11/34* | (2006.01) |
| *G11C 29/00* | (2006.01) |
| *G11C 29/44* | (2006.01) |
| *G11C 29/52* | (2006.01) |
| *G11C 29/04* | (2006.01) |

(52) U.S. Cl.
CPC .......... *G11C 29/00* (2013.01); *G11C 29/4401* (2013.01); *G11C 29/52* (2013.01); *G11C 29/76* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 2005/0268205 A1* | 12/2005 | Rhee | H03M 13/091 714/758 |
| 2008/0055990 A1 | 3/2008 | Ishikawa et al. | |
| 2014/0281770 A1 | 9/2014 | Kim et al. | |
| 2015/0293716 A1* | 10/2015 | Jiang | H03M 13/13 711/154 |
| 2016/0049203 A1* | 2/2016 | Alrod | G11C 16/26 714/2 |

\* cited by examiner

*Primary Examiner* — Son Dinh
*Assistant Examiner* — Sultana Begum
(74) *Attorney, Agent, or Firm* — IP & T Group LLP

(57) ABSTRACT

A method of controller optimization utilizing over-sampling read (OSR) in a memory device includes performing a first internal read at a predetermined threshold level and transferring the first internal read measurement to the controller, performing a second internal read in a range that is between the predetermined threshold level plus a first predetermined value and the predetermined threshold level minus a second predetermined value, and determining whether a cell level falls in the range and transferring the second internal read measurement to the controller.

18 Claims, 5 Drawing Sheets

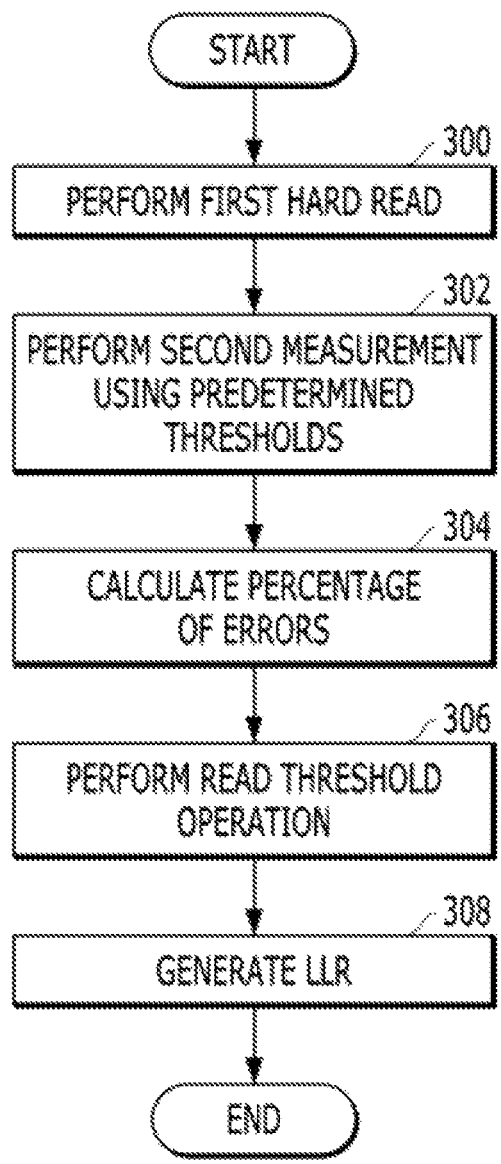

METHODS OF SYSTEM OPTIMIZATION BY OVER-SAMPLING READ

CROSS-REFERENCE TO RELATED APPLICATIONS

This application claims the benefit of U.S. Provisional Application No. 62/101,308 filed Jan. 8, 2015 entitled "METHODS OF SYSTEM OPTIMIZATION BY OVER-SAMPLING READ", the entire contents of which are incorporated herein by reference.

BACKGROUND

1. Field

Exemplary embodiments of the present disclosure relate to a signal processing and coding technique.

2. Description of the Related Art

Magnetic storage technology was most commonly used for storing data, but the lower weight and faster read/write operations requirements for current electronic devices make the magnetic storage technology less desirable. The NAND based technology is able to fulfill the demand for high density data storage devices but this technology is costly. There exists a need to lower the cost of NAND-based technology while maintaining performance levels.

SUMMARY

Aspects of the invention include a method of controller optimization utilizing over-sampling read (OSR) in a memory device. The methods may include performing a first internal read at a predetermined threshold level and transferring the first internal read measurement to the controller, performing a second internal read in a range that is between the predetermined threshold level plus a first predetermined value and the predetermined threshold level minus a second predetermined value, and determining whether a cell level falls in the range and transferring the second internal read measurement to the controller.

Further aspects of the invention include a system for controller optimization utilizing over-sampling read (OSR). The systems may include a NAND memory device including a controller, the device suitable for performing a first internal read at a predetermined threshold level and transferring the first internal read measurement to the controller, performing a second internal read in a range that is between the predetermined threshold plus a first predetermined value and the predetermined threshold minus a second predetermined value, and determining whether a cell level falls in the range and transfer the second internal read measurement to the controller

BRIEF DESCRIPTION OF THE DRAWINGS

FIG. 3 is a flow chart of steps for methods utilizing OSR according to aspects of the invention.

DETAILED DESCRIPTION

Figure 1:
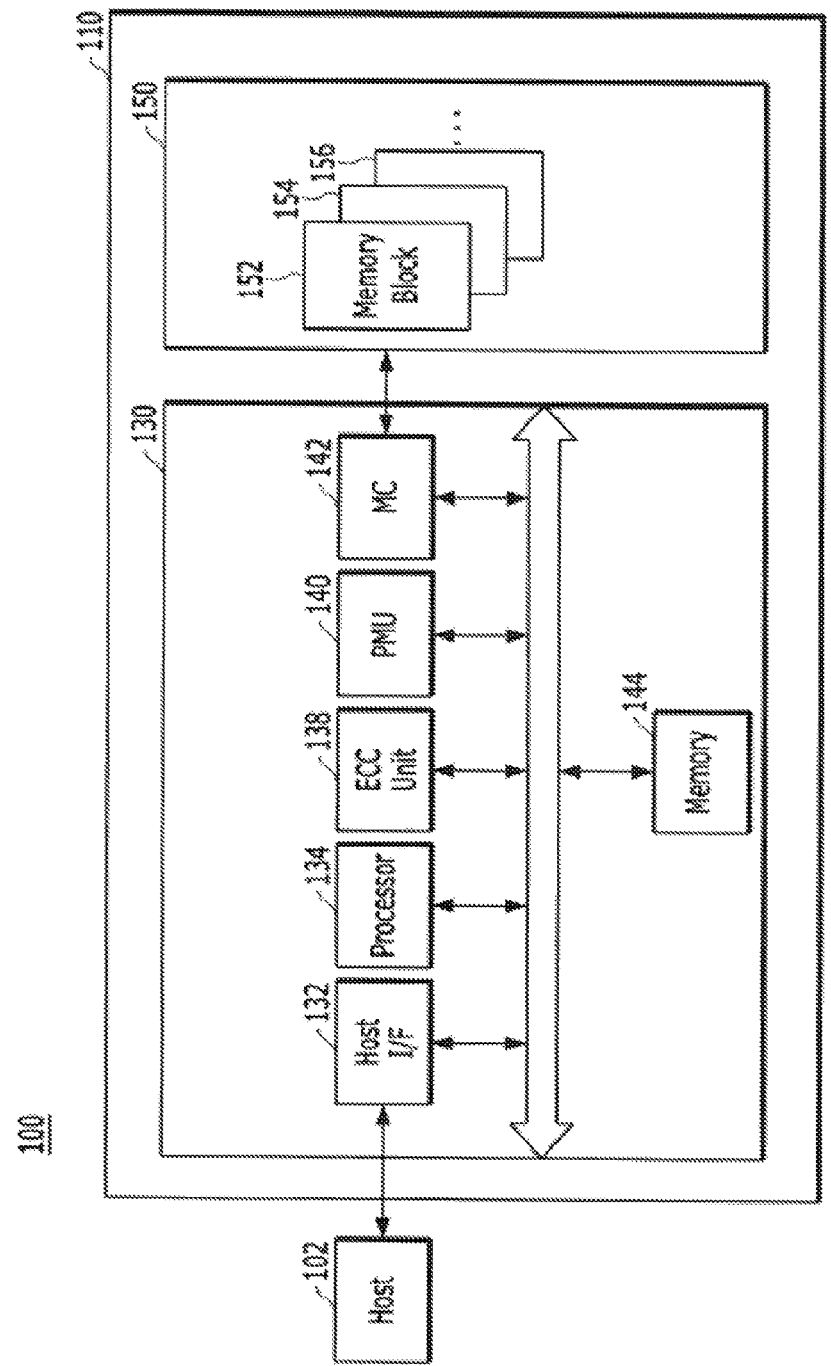
FIG. 1 is a diagram of an example memory system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In some embodiments, the present invention will be applied to a data processing system shown in FIG. 1.

FIG. 1 illustrates a data processing system 100 including a memory system in which embodiments of the present invention are applied. The data processing system 100 shown in FIG. 1 is for illustration only. Other constructions of the data processing system 100 could be used without departing from the scope of this disclosure. Although FIG. 1 illustrates one example of the data processing system 100, various changes may be made to FIG. 1. For example, the data processing system 100 may include any of elements, or may not include any of elements in any suitable arrangement.

Referring to FIG. 1, the data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory device 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a non-volatile memory device, for example, a flash memory. The flash memory may have a three-dimensional (3D) stack structure.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit (PMU) 140, a memory controller (MC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The MC 142 may serve as a memory interface between the controller 130 and the memory device 150 to allow the controller 130 to control the memory device 150 in response to a request from the host 102. The MC 142 may generate control signals for the memory device 150 and process data under the control of the processor 134. When the memory device 150 is a flash memory such as a NAND flash memory, the MC 142 may generate control signals for the NAND flash memory 150 and process data under the control of the processor 134.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fall seriously deteriorates the utilization efficiency of the memory device 150 having a 3D stack structure and the reliability of the memory system 110, and thus reliable bad block management is required.

Figure 2:
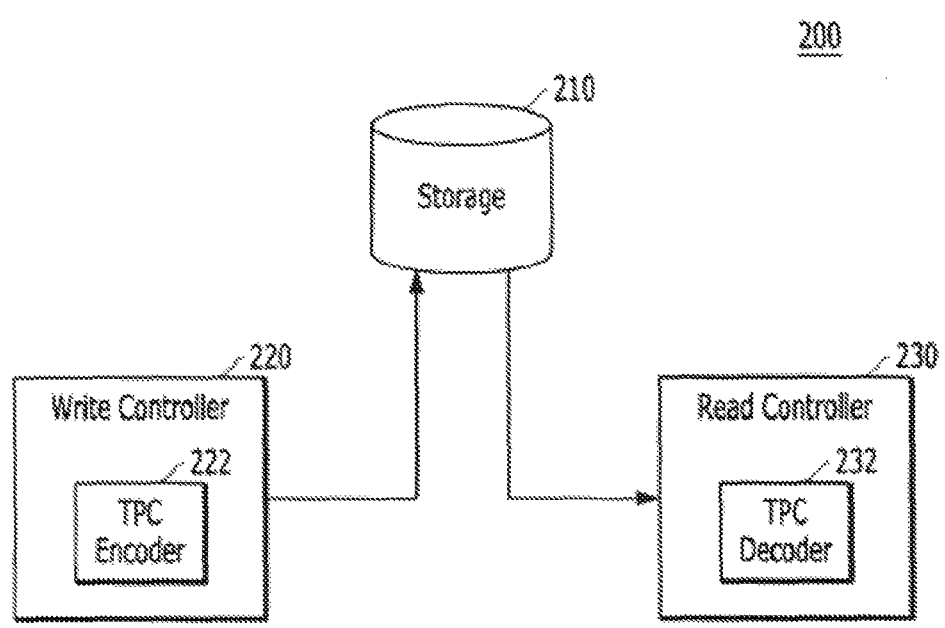
FIG. 2 is a diagram of components of an example memory system.

FIG. 2 is a block diagram of a memory system 200 including an encoder and a decoder in accordance with embodiments of the present invention. For example, the memory system 200 corresponds to the memory system 110 shown in FIG. 1. For clarity, components of FIG. 1 which are directly related to embodiments of the present invention are not shown herein.

Referring to FIG. 2, the memory system 200 includes a storage 210, a write controller 220 and a read controller 230. For example, the storage 210 corresponds to the memory device 150 shown in FIG. 1, and the write controller 220 and the read controller 230 correspond to the ECC unit 138 shown in FIG. 1.

The storage 210 may include solid state storage such as NAND flash. The write controller 220 receives data from host 102 in FIG. 1, and processes the data on the storage 210. The read controller 230 reads the data on the storage 210, and processes the data. The write controller 220 includes a TPC encoder 222 and the read controller 230 include a TPC decoder 232 as the components for the TPC scheme, respectively.

In normal hard read of NAND flash memory, a predetermined read threshold will be used to compare against the cell levels. Taking an SLC device as an example, if the cell level is lower than the threshold, the hard read result is a 1, otherwise a 0. The 0's and 1's will be transferred back to controller for further processing. Although the disclosure herein uses SLC as an example, the systems and processed may be implemented/generalized to MLC/TLC by optimizing a threshold at a time as the optimization of one threshold does not depend on the optimality of other thresholds, as will be understood by one of skill in the art from the disclosure herein. Often, it is power consuming and time consuming to accomplish certain functionalities by only using hard-read. For example, in soft data generation, hard reads have to be performed multiple times in order to get soft log-likelihood ratio (LLR) information for soft decoding use. One other example is read threshold optimization. To find optimal read threshold, multiple hard reads need to be performed. Another example is read-reclaim. A hard read is performed at some neighboring pages and the data is decoded from time to time to prevent uncorrectable errors.

Other than the hard read, some NAND devices also support another read mode which is called over-sampling read (OSR). As disclosed herein, it will be shown that OSR can simplify the algorithms and reduce the power and latency for many of the existing functionalities of controller and NAND products.

The scheme disclosed herein is a data refresh method using OSR which does the same functionality of read-reclaim, but does not rely on the ECC decoder, which means the method can be performed on the NAND side. This advantageously saves time and power spent in data transfer and decoding.

Furthermore, an additional scheme disclosed herein is a method for LLR generation by using OSR.

Referring to FIGS. 3-6, the disclosed schemes will be described. FIG. 3 is a flowchart of steps for methods according to aspects of the invention. FIGS. 4A-6 show graphically aspects of the present invention.

At step 300, a first hard read is performed. In an example using SLC and page length of N bits, the first internal read is the same as a normal hard read (although a SLC example is described, it is contemplated that the invention may be implemented in MLC designs). A predetermined first threshold t is used to compare against all cell levels. This is depicted by the graph 400 at FIG. 4A. Based on the relative location of the cell levels, hard data is generated and then transferred to the controller.

At step 302, a second measurement is performed using predetermined thresholds. As shown in the graph 402 of FIG. 4B, the NAND performs a second round of measurements internally using a range t+d and t−d. In the example shown, the range is between the predetermined threshold level t plus a predetermined value d and the predetermined threshold level t minus the predetermined value d. In an embodiment, the predetermined values d are equal. Although in the example described herein, the predetermined values are shown to be equal, it is contemplated that various ranges may be utilized and that the invention is not limited to the predetermined values being equal. For example, the range may be between the predetermined threshold level t plus a first predetermined value a and the predetermined threshold level t minus a second predetermined value b (e.g., t+a and t−b). A range may be selected by a factor value x. For example, the range may be between t+0.5*x and t−1.5*x, or vice versa. Other suitable ranges will be understood to those of skill in the art from the disclosure herein.

If a cell level falls between these two thresholds (e.g., falls between the range), the second measurement is a 0. If a cell level does not fall between these two thresholds, the second measurement is a 1. The results of the second round of measurements is also transferred to the controller.

OSR generates data based on 3 different thresholds, but only transfers 2N bits to the controller. The first N bits are the same as the normal hard read results. The second N bits are a sort of metric indicating how reliable the first measurement is. Comparing to a normal read, which issues 3 hard read commands and transfers 3N bits to the controller, OSR is faster.

At step 304, a percentage of errors is calculated. Advantageously, the disclosed schemes can estimate the number of errors without decoding the data. In the design of the ECC engine, the maximum number of correctable errors is known. For example, an example BCH code can correct up to Tmax=130 errors. Ordinarily, the noisy data needs to be decoded to determine the number of errors. However, by using OSR, decoding is not needed such that the number of errors can be estimated.

Figure 5:
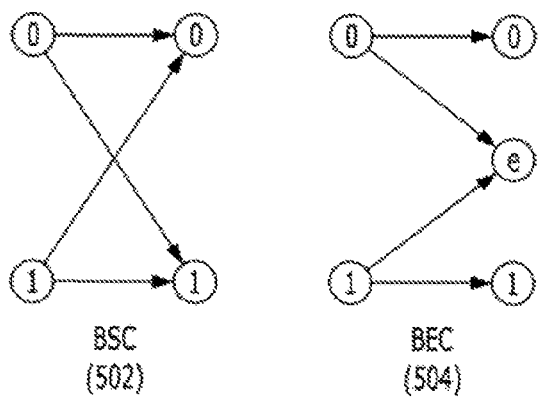
FIG. 5 is a diagram of various code implementations in accordance with aspects of the invention.
Figure 6:
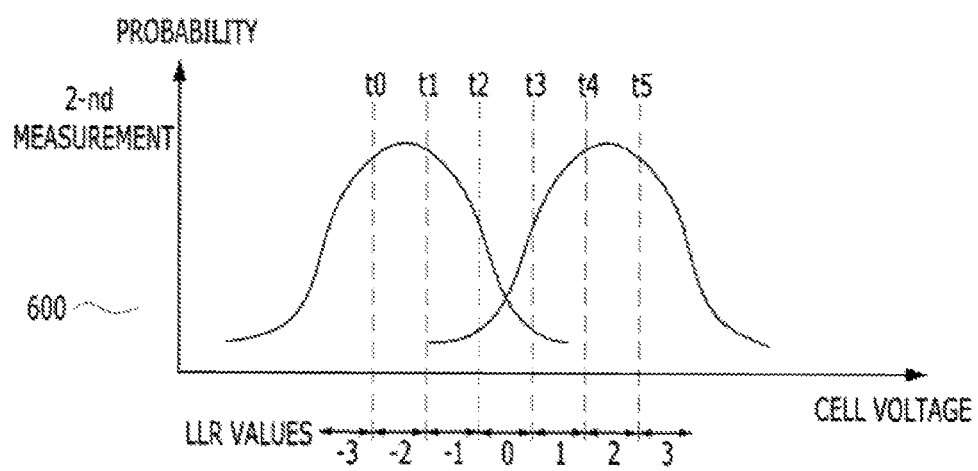
FIG. 6 is a graph depicting LLR generation and OSR LLR generation in accordance with aspects of the invention.

With reference to FIG. 5, in coding theory, error correcting code which can correct e errors in binary-symmetric channel (BSC) 500 can correct 2e erasures in the binary erasure channel (BEC) 502. In the BSC, channel inputs can be either 0 or 1, and the output can be either or 1 with certain cross-over (0 becomes 1 or 1 becomes 0) probability. In an embodiment, the BSC channel is a model for hard reads. In the BEC, channel inputs can be either 0 or 1, and the channel output can be 0, 1 or erasure. 0 can go to either 0 or erasure, and 1 can only go to 1 or erasure. Thus, the BEC is a good model for OSR. The cells with cell levels in between t+d and t−d can be thought of as erasures in the BEC.

Advantageously, the second measurement of OSR can provide the number of bits which are erasures without decoding the data. Based on the erasure count, it is known how far away from the error correction capability of the ECC engine. The percentage of errors can be calculated as $$\frac{\text{\# erasures}}{2T_{max}}.$$

For example, if $T_{max}$=130 BCH code, and the second measurement of OSR determines that there are 200 cells whose cell levels fall in between t+d and t−d, it can be determined that $$\frac{200}{130*2} = 77\%$$

of the error correcting capability is reached. This is an estimation of number of errors rather than the precise number of errors. Since reclaim happens much earlier than reaching 100% of the $T_{max}$, an estimation is safe enough.

At step 306, a read threshold optimization is performed. By using OSR, the read threshold optimization can be simplified by finding the predetermined first threshold (t) which will give the minimum number of errors. The optimization does not require decoding and can be done in the background so that it does not degrade performance. The algorithm is described below.

Occasionally, when the read threshold optimization is performed for the desired pages, multiple rounds of OSR are performed by using different thresholds around the pre-determined value (e.g., t). If the pre-determined threshold provides the minimum number of erasures, the pre-determined threshold may be continued to be used. If a lower number of erasures than the pre-determined threshold is found, the pre-determined threshold will be updated to be the one provides the lowest number of erasures. The size of the window and step size can be chosen based on the NAND statistics. Larger window size and smaller step size provides a better optimization quality, but it takes more time.

There may be multiple reasons to trigger read threshold optimization, for example, hard decoding failure, zone change of PE counts, read disturbance count is too high and so on. The optimization can also be block-based or page-based. Block-based optimization only samples a few pages in a block and optimize the threshold. Block-based optimization is simple, and can keep track of the block-level voltage changes such as retention and charge loss, etc. Page-based optimization takes more time and power, but it can prevent errors due to page-level failures such as read disturbance, ICI, etc.

The above described optimization does not require decoding the data, so it can be implemented on the NAND side, saving data transfer time and power.

At step 308, an LLR may be generated. Previously, several (greater than 2 for example) hard reads are usually performed to generate LLR. Referring to the graph 600 at FIG. 6, for example, usually 6 hard reads need to be performed to generate a 3-bit LLR. If the cell level is to the left of to, the LLR value is set to −3. If the cell level is in between $t_0$ and $t_1$, the LLR value is set to −2 and so on.

Figure 4A:
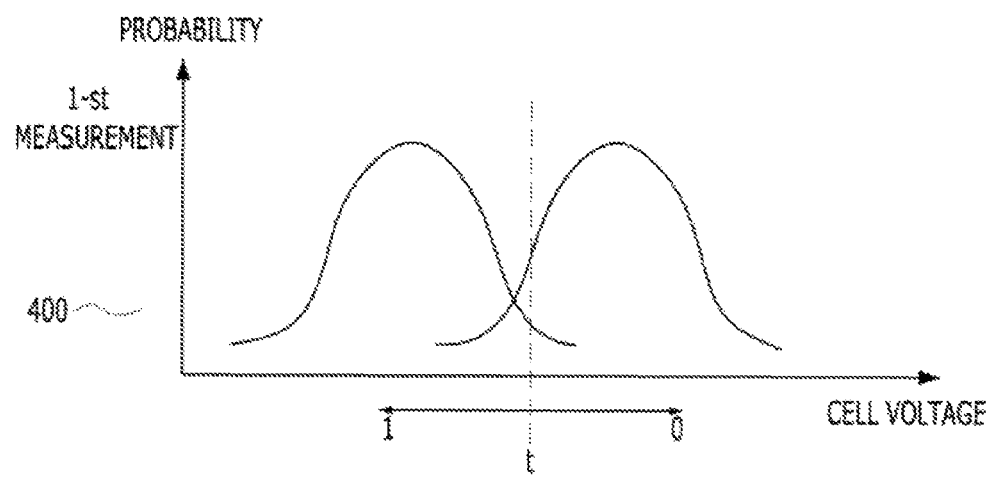
FIGS. 4A and 4B are graphs depicting examples of OSR in accordance with aspects of the invention.
Figure 4B:
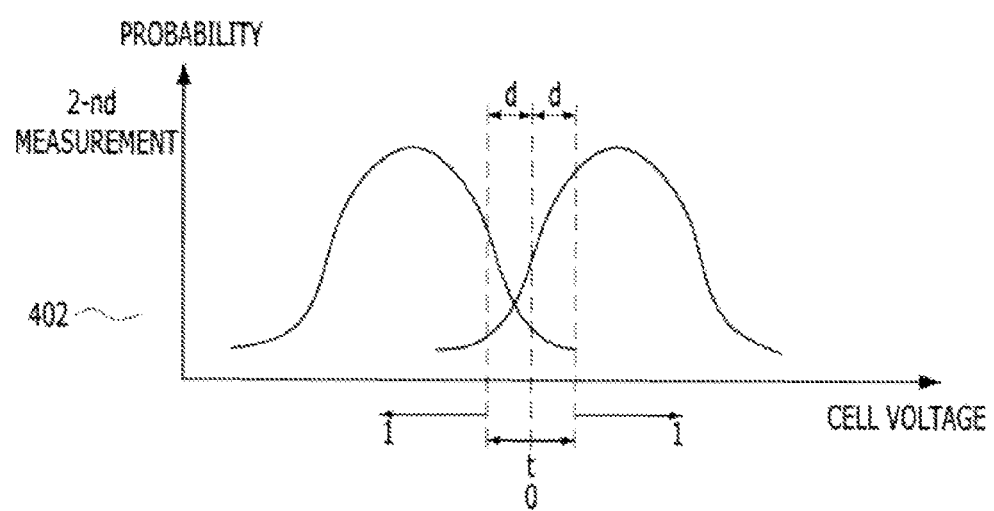

However, using OSR as disclosed herein and by choosing $t=t_1$ with $d=t_1-t_0$, and $t=t_4$ with $d=t_4-t_3$, the same LLR generation functionality is achieved by only two or less OSR reads (using these values as shown in FIGS. 4A and 4B). This saves about 50% of the total transfer time and power. Advantageously, the thresholds can be optimized by the read threshold optimization beforehand, so that the best starting points are already had for producing more accurate LLR values.

While the present invention has been particularly shown and described with reference to exemplary embodiments thereof, it will be understood by those of ordinary skill in the art that various changes in form and details may be made therein without departing from the spirit and scope of the present invention as defined by the following claims. Thus, the foregoing is by way of example only and is not intended to be limiting. For example, any numbers of elements illustrated and described herein are by way of example only. The present invention is limited only as defined in the following claims and equivalents thereof.

What is claimed is:

1. A method of controller optimization utilizing over-sampling read (OSR) in a memory device, comprising:
    performing a first internal read at a predetermined threshold level and transferring the first internal read measurement to the controller;
    performing a second internal read in a range that is between the predetermined threshold level plus a first predetermined value and the predetermined threshold level minus a second predetermined value;
    measuring whether a cell level falls in the range and transferring second internal read measurement using the range to the controller, wherein the second internal read measurement is 0 when the cell level falls in the range, and the second internal read measurement is 1 when the cell level does not fall in the range;
    generating an erasure count in accordance with the second internal read measurement;
    estimating a number of errors in accordance with a percentage of errors calculated based on at least the erasure count, without decoding the first internal read measurement or second internal read measurement; and
    optimizing a read threshold in accordance with at least the number of errors.

2. The method of claim 1, wherein the memory device has a page length of N, such that transferring the first internal read measurement to the controller and transferring the second internal read measurement to the controller transfers 2*N bits to the controller.

3. The method of claim 1, further comprising performing a read-reclaim by:
    determining a number of erasures within the range; and determining a percent of an error correcting capability based on the number of erasures and a code length.

4. The method of claim 3, wherein the first internal read is performed in binary-symmetric channel.

5. The method of claim 3, wherein the second internal read is performed in binary erasure channel.

6. The method of claim 1, further comprising performing a read threshold optimization by:
determining whether the pre-determined threshold level provides a minimum number of erasures.

7. The method of claim 4, further comprising updating the pre-determined threshold level when it is determined that the pre-determined threshold level does not provide the minimum number of erasures.

8. The method of claim 1, further comprising generating an LLR with two or less OSR reads.

9. The method of claim 1, wherein the first predetermined value and the second predetermined value are equal.

10. A system for controller optimization utilizing over-sampling read (OSR), comprising:
a NAND memory device including a controller, the NAND memory device is configured to:
perform a first internal read at a predetermined threshold level and transferring the first internal read measurement to the controller;
perform a second internal read in a range that is between the predetermined threshold plus a first predetermined value and the predetermined threshold minus a second predetermined value;
measure whether a cell level falls in the range and transfer second internal read measurement using the range to the controller, wherein the second internal read measurement is 0 when the cell level falls in the range, and the second internal read measurement is 1 when the cell level does not fall in the range;
generate an erasure count in accordance with the second internal read measurement;
estimate a number of errors in accordance with a percentage of errors calculated based on at least the erasure count, without decoding the first internal read measurement or second internal read measurement; and
optimize a read threshold in accordance with at least the number of errors.

11. The system of claim 10, wherein the memory device has a page length of N, such that transferring the first internal read measurement to the controller and transferring the second internal read measurement to the controller transfers 2*N bits to the controller.

12. The system of claim 10, wherein the device is further suitable for:
determining a number of erasures within the range; and
determining a percent of an error correcting capability based on the number of erasures and a code length to perform a read-reclaim.

13. The system of claim 12, wherein the first internal read is performed in binary-symmetric channel.

14. The system of claim 12, wherein the second internal read is performed in binary erasure channel.

15. The system of claim 10, wherein the device is further suitable for determining whether the pre-determined threshold level provides a minimum number of erasures to perform a read threshold optimization.

16. The system of claim 15, wherein the device is further suitable for updating the pre-determined threshold level when it is determined that the pre-determined threshold level does not provide the minimum number of erasures.

17. The system of claim 10, wherein the device is suitable for generating an LLR with two or less OSR reads.

18. The system of claim 10, wherein the first predetermined value and the second predetermined value are equal.

* * * * *